(12) United States Patent
Kawakami

(10) Patent No.: US 7,282,835 B2
(45) Date of Patent: Oct. 16, 2007

(54) SURFACE ACOUSTIC WAVE ELEMENT

(75) Inventor: Takeshi Kawakami, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 295 days.

(21) Appl. No.: 10/543,808

(22) PCT Filed: Apr. 19, 2004

(86) PCT No.: PCT/JP2004/005552

§ 371 (c)(1),
(2), (4) Date: Aug. 1, 2005

(87) PCT Pub. No.: WO2005/002049

PCT Pub. Date: Jan. 6, 2005

(65) Prior Publication Data

US 2006/0131991 A1    Jun. 22, 2006

(30) Foreign Application Priority Data

Jun. 26, 2003  (JP)  ............................. 2003-183094

(51) Int. Cl.
*H01L 41/08*   (2006.01)

(52) U.S. Cl. ............................. 310/313 A; 310/313 R; 310/344

(58) Field of Classification Search ............ 310/313 A, 310/313 R, 344
See application file for complete search history.

(56) References Cited

U.S. PATENT DOCUMENTS

| | | | | |
|---|---|---|---|---|
| 4,381,469 A | * | 4/1983 | Ogawa et al. .......... | 310/313 R |
| 5,889,446 A | * | 3/1999 | Yamada et al. ............. | 333/193 |
| 5,923,231 A | * | 7/1999 | Ohkubo et al. ............. | 333/193 |
| 6,557,225 B2 | * | 5/2003 | Takata et al. ............... | 29/25.35 |
| 6,710,682 B2 | * | 3/2004 | Onishi et al. ............... | 333/193 |
| 6,831,340 B2 | * | 12/2004 | Araki .......................... | 257/416 |
| 6,969,945 B2 | * | 11/2005 | Namba et al. .............. | 310/340 |

FOREIGN PATENT DOCUMENTS

| | | |
|---|---|---|
| JP | 06-132758 | 5/1994 |
| JP | 06-152299 | 5/1994 |
| JP | 08-026730 | 1/1996 |
| JP | 08-097671 | 4/1996 |
| JP | 08-307190 | 11/1996 |
| JP | 10-107573 | 4/1998 |
| JP | 10-209801 | 8/1998 |
| JP | 11-092147 | 4/1999 |
| JP | 11-274883 | 10/1999 |
| JP | 2000-058593 | 2/2000 |
| JP | 2000-183680 | 6/2000 |
| JP | 2000-517144 | 12/2000 |

(Continued)

OTHER PUBLICATIONS

Official Communication dated Aug. 10, 2004, issued in the corresponding PCT Application No. PCT/JP2004/005552.

*Primary Examiner*—Mark Budd
(74) *Attorney, Agent, or Firm*—Keating & Bennett, LLP

(57) ABSTRACT

A highly reliable surface acoustic wave device includes a low-resistance piezoelectric substrate that is difficult to reoxidize even in a high-temperature atmosphere containing oxygen. The piezoelectric substrate has a specific resistance of about $1.0 \times 10^7$ Ω·cm to about $1.0 \times 10^{13}$ Ω·cm, an interdigital electrode on a main surface of the substrate, and a protective film covering the interdigital electrode.

21 Claims, 7 Drawing Sheets

FOREIGN PATENT DOCUMENTS

| | | |
|---|---|---|
| JP | WO 98/57426 A1 | 12/2000 |
| JP | 2001-102898 | 4/2001 |
| JP | 2001-168676 | 6/2001 |
| JP | 2001-345657 | 12/2001 |
| JP | 2002-026687 | 1/2002 |
| JP | 2003-017981 | 1/2003 |
| JP | 2003-23187 | 1/2003 |
| JP | 2003-264448 | 9/2003 |

\* cited by examiner

SURFACE ACOUSTIC WAVE ELEMENT

BACKGROUND OF THE INVENTION

1. Field of the Invention

The present invention relates to surface acoustic wave elements for use in, for example, surface acoustic wave filters or the like, and more specifically, the present invention relates to a surface acoustic wave element that has a structure that prevents electrodes from being broken by the pyroelectric effect of the piezoelectric substrate.

2. Description of the Related Art

In a surface acoustic wave element, electrodes connected to different potentials of the interdigital transducer (IDT) may cause electric discharge due to: (a) electrical charges on the surface of the piezoelectric substrate resulting from the pyroelectric effect of the substrate produced by temperature changes; or (b) electrical charges induced by applying a surge voltage. If the amount of electric discharge is large, the electrodes are degraded or broken. Accordingly, the characteristics of the surface acoustic wave element are deteriorated.

In order to prevent the electric discharge from damaging the electrode, the specific resistance of the piezoelectric substrate can be reduced. A reduced specific resistance of the substrate allows electrical charges suddenly produced on the surface of the substrate to move on the surface of the substrate to reduce the potential difference rapidly. Thus, electric discharge resulting from local charge accumulation can be prevented. Consequently, the resistances to pyroelectric destruction and to electric power can be enhanced in a surface acoustic wave device using a piezoelectric substrate, such as a surface acoustic wave filter.

Some approaches for reducing the specific resistance of the substrate have been known in which the substrate may be doped with Fe or other carriers from the surface, or the substrate may be heated in a reducing atmosphere of a specific gas under reduced pressure.

For example, Japanese Unexamined Patent Application Publication No. 11-92147 has disclosed $LiNbO_3$ and $LiTaO_3$ crystals preconditioned so as to increase the ability to reduce surface charging and a method for preparing those crystals. More specifically, Japanese Unexamined Patent Application Publication No. 11-92147 has disclosed a method of heat-treating a $LiNbO_3$ or $LiTaO_3$ crystal in a reducing atmosphere at a temperature of 500° C. to 1,140° C. under reduced pressure. However, this publication has not described specific conditions of the reduced pressure in the reducing atmosphere. According to this method, a gas, such as argon, water, hydrogen, nitrogen, carbon dioxide, carbon monoxide, oxygen, or a mixture thereof is used for preparing the reducing atmosphere.

In general, in the manufacturing process of a surface acoustic wave device, some steps are performed in a high-temperature atmosphere containing oxygen. For example, in a manufacturing process of a chip-size-packaged surface acoustic device in which a surface acoustic wave element is mounted on a mount board by flip chip bonding and sealed with a resin, the step of the flip chip bonding and the step of thermally curing the resin are performed in high-temperature atmospheres containing oxygen. In a manufacturing process of a surface acoustic wave device in which a surface acoustic wave element is mounted on a ceramic package by flip chip bonding, the step of the flip chip bonding is performed in a high-temperature atmosphere containing oxygen. In a manufacturing process of a surface acoustic wave device including the step of mounting a surface acoustic wave element to a ceramic package by wire-bonding after die bonding, the step of thermally curing a die bonding agent is performed in a high-temperature atmosphere containing oxygen.

Although the specific resistance of the piezoelectric substrate used for the surface acoustic wave element is reduced by heat treatment under reduced pressure in a reducing atmosphere, as disclosed in the Japanese Unexamined Patent Application Publication No. 11-92147, the piezoelectric substrate is reoxidized if the surface acoustic wave element is exposed to a high-temperature atmosphere containing oxygen in the above-described manufacturing processes of the surface acoustic wave device. In the resulting surface acoustic wave device, therefore, the piezoelectric substrate is liable to experience the pyroelectric effect again, in spite of using the method of Japanese Unexamined Patent Application Publication No. 11-92147. Consequently, electric discharge occurs between electrodes connected to different potentials of the IDT, and degrades or damages the electrodes disadvantageously.

SUMMARY OF THE INVENTION

In order to overcome the problems described above, preferred embodiments of the present invention provide a highly reliable surface acoustic wave element including a piezoelectric substrate with a reduced specific resistance. The surface acoustic wave element does not allow the pyroelectric effect to reproduce, and accordingly, its electrodes are not easily degraded or broken.

According to a first preferred embodiment of the present invention, a surface acoustic wave element includes a piezoelectric substrate having a specific resistance in a range of about $1.0 \times 10^7$ Ω·cm to about $1.0 \times 10^{13}$ Ω·cm, an interdigital electrode disposed on one of the main surfaces of the piezoelectric substrate, and a protective film covering the interdigital electrode.

According to a second preferred embodiment of the present invention, a surface acoustic wave element includes a piezoelectric substrate having a specific resistance in a range of about $1.0 \times 10^7$ Ω·cm to about $1.0 \times 10^{13}$ Ω·cm, an interdigital electrode overlying one of the main surfaces of the piezoelectric substrate, and a protective film underlying the interdigital electrode.

In the surface acoustic wave element according to the second preferred embodiment, a second protective film may further be arranged so as to cover the interdigital electrode.

In preferred embodiments of the present invention, the protective film may preferably be made of a material selected from the group consisting of SiN, ZnO, and $SiO_2$.

The protective film may preferably include a SiN or ZnO layer and a $SiO_2$ layer deposited on the SiN or ZnO layer.

The piezoelectric substrate may preferably be made of $LiTaO_3$ or $LiNbO_3$.

The surface acoustic wave device may further include an electrode pad for establishing external electrical connection, disposed on the piezoelectric substrate. In this instance, the protective film is arranged so as to have a region at which the electrode pad is exposed, and the region has an area smaller than the area of the electrode pad.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to the drawings.

Figure 1A:
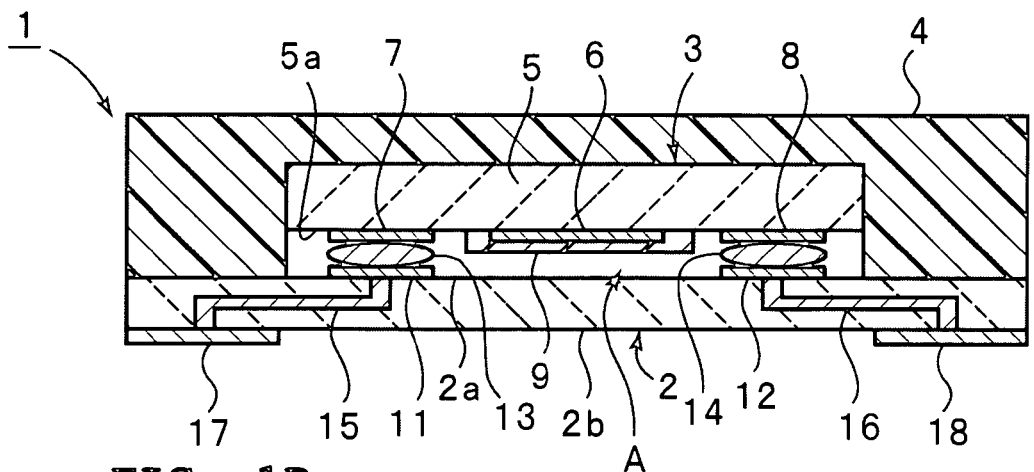
FIG. 1A is a schematic front sectional view of a surface acoustic wave device according to a first preferred embodiment of the present invention.
Figure 1B:
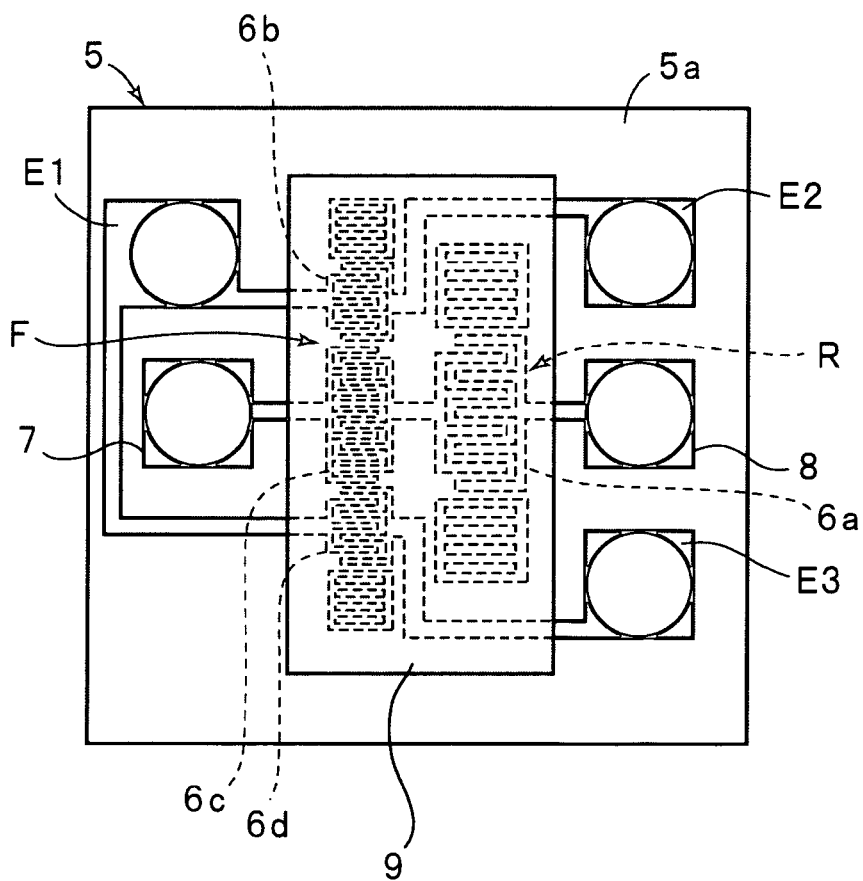
FIG. 1B is a schematic plan view of the structure of electrodes of a surface acoustic wave element used in the surface acoustic wave device of FIG. 1A.

FIG. 1A and FIG. 1B are a schematic front sectional view of a surface acoustic wave device according to a first preferred embodiment of the present invention and a schematic plan view of the structure of electrodes of a surface acoustic wave element used in the surface acoustic wave device, respectively.

A surface acoustic wave device 1 includes a surface acoustic wave element 3 mounted on a mount board 2 preferably by face-down bonding. The surface acoustic wave element 3 is covered with a sealing resin 4.

The surface acoustic wave element 3 includes a piezoelectric substrate 5. As shown in FIG. 1A, interdigital electrodes 6 and electrode pads 7 and 8 are disposed on one main surface 5a of the piezoelectric substrate 5. The electrode pads 7 and 8 are electrically connected to comb-like electrodes 6b and 6a of the interdigital electrodes 6, respectively.

Although FIG. 1A shows only the interdigital electrodes 6 and the electrode pads 7 and 8 in the surface acoustic wave element 3 for ease of understanding the structure, the surface acoustic wave element 3 of the present preferred embodiment has the structure shown in FIG. 1B. Specifically, a single port SAW resonator R and a longitudinally coupled resonator type surface acoustic wave filter F capable of balanced-to-unbalanced conversion are disposed on the piezoelectric substrate 5, as shown in FIG. 1B. The single port SAW resonator R includes an interdigital electrode 6a and a pair of reflectors disposed on both sides of the interdigital electrode 6a. The longitudinally coupled resonator type surface acoustic wave filter F preferably includes three interdigital electrodes 6b to 6d and a pair of reflectors disposed at both ends of the line of the interdigital electrodes 6b to 6d, for example.

As shown in FIG. 1B, the interdigital electrodes 6a and 6b to 6d and the other electrodes constituting the surface acoustic wave resonator R and longitudinally coupled resonator type surface acoustic wave filter F are coated with a protective film 9. In addition to the electrode pads 7 and 8, electrode pads E1 to E3 connected to the ground potential are also provided on the main surface 5a of the piezoelectric substrate 5. For ease of understanding the function of the protective film 9, FIG. 1A schematically shows the structure of the electrodes.

The piezoelectric substrate 5 is preferably made of a specially treated piezoelectric single crystal, such as $LiTaO_3$ or $LiNbO_3$. The piezoelectric substrate 5 preferably has a specific resistance of about $1.0 \times 10^7$ $\Omega \cdot cm$ to about $1.0 \times 10^3$ $\Omega \cdot cm$ in the thickness direction. A piezoelectric substrate with a specific resistance of more than about $1.0 \times 10^{13}$ $\Omega \cdot cm$ produces the pyroelectric effect, and is liable to degrade or brake the interdigital electrodes if its temperature is changed. A piezoelectric substrate with a specific resistance of less than about $1.0 \times 10^7$ $\Omega \cdot cm$ has low piezoelectric, and accordingly exhibits characteristics sufficient for a surface acoustic wave element.

This level of the specific resistance can be achieved by reducing a piezoelectric single crystal substrate with oxygen.

A piezoelectric substrate 5 having a specific resistance of about $1.0 \times 10^{13}$ $\Omega \cdot cm$ or less hardly has the pyroelectric effect.

The interdigital electrodes 6 and the electrode pads 7 and 8 are preferably made of an elemental metal, such as Cu or Al, or its alloy.

The surface acoustic wave element 3 is mounted on the mount board 2 such that its main surface 5a faces downward.

More specifically, electrode pads 11 and 12 are provided on the upper surface 2a of the mount board 2, and the electrode pads 11 and 12 are bonded to the electrode pads 7 and 8 of the surface acoustic wave element 3 preferably via metal bumps 13 and 14, respectively. The metal bumps 13 and 14 may be formed of an appropriate metal material, such as an elemental metal or solder.

The mount board 2 has connecting electrodes 15 and 16 inside. The upper ends of the connecting electrodes 15 and 16 extend to the upper surface 2a of the mount board to establish electrical connections with the electrode pads 11 and 12.

The lower ends of the connecting electrodes 15 and 16 extend to the bottom surface 2b of the mount board 2 to establish electrical connections with terminal electrodes 17 and 18 disposed on the bottom surface 2b.

The electrode pads 11 and 12, connecting electrodes 15 and 16, and terminal electrodes 17 and 18 of the mount board 2 are preferably made of an appropriate metal, such as Al or Cu, or other suitable material.

The mount board 2 is made of an insulating ceramic, such as alumina, an insulating resin, or other suitable material.

The surface acoustic wave element 3 is mounted on the mount board 2, as described above, with a space therebetween. This space A ensures the oscillation of the surface acoustic wave element 3 to prevent the degradation of the characteristics. The space A is sealed with the sealing resin 4. The sealing resin 4 is bonded to the upper surface 2a of the mount board 2, with contacts with the upper surface and sides of the surface acoustic wave element 3.

The surface acoustic wave device 1 includes the protective film 9 of the surface acoustic wave element 3. The protective film 9 is intended to prevent the piezoelectric substrate 5 from reproducing the pyroelectric effect in steps performed in a high-temperature atmosphere containing oxygen during the manufacturing process of the surface acoustic wave device 1. The protective film 9 can be formed of any material as long as it acts as intended. Examples of the material of the protective film 9 include SiN, ZnO, and $SiO_2$. Preferably, SiN is used because it does not contain oxygen. A $SiO_2$ or ZnO protective film 9 can of course prevent reoxidation of the piezoelectric substrate 5.

The protective film 9 in the present preferred embodiment covers the region where the interdigital electrodes 6 are formed, as shown in FIG. 1B. Therefore the surface of the piezoelectric substrate 5 is not brought into contact with the atmosphere, in the region where the interdigital electrodes 6 are located. Consequently, the piezoelectric substrate 5 in this region can be prevented from reoxidizing.

The steps that are performed in a high-temperature atmosphere containing oxygen and may cause the substrate to reoxidize are subsequent to the formation of the surface acoustic wave element 3, and such steps include bonding the surface acoustic wave element 3 to the mount board 2 by a face-down technique and thermally curing the sealing resin 4, as described above. Although these steps are performed in a high-temperature atmosphere containing oxygen, the region covered with the protective film 9 of the piezoelectric substrate 5 is not reoxidized in the present preferred embodiment because of the presence of the protective film 9. Accordingly, the electrodes are not easily degraded or broken by the pyroelectric effect of the surface acoustic wave device 1 or the application of surge voltage. This will be further described with reference to experiments.

$LiTaO_3$ substrates having a specific resistance of about $1.0 \times 10^7$ Ω·cm to about $1.0 \times 10^{13}$ Ω·cm were prepared.

Figure 2:
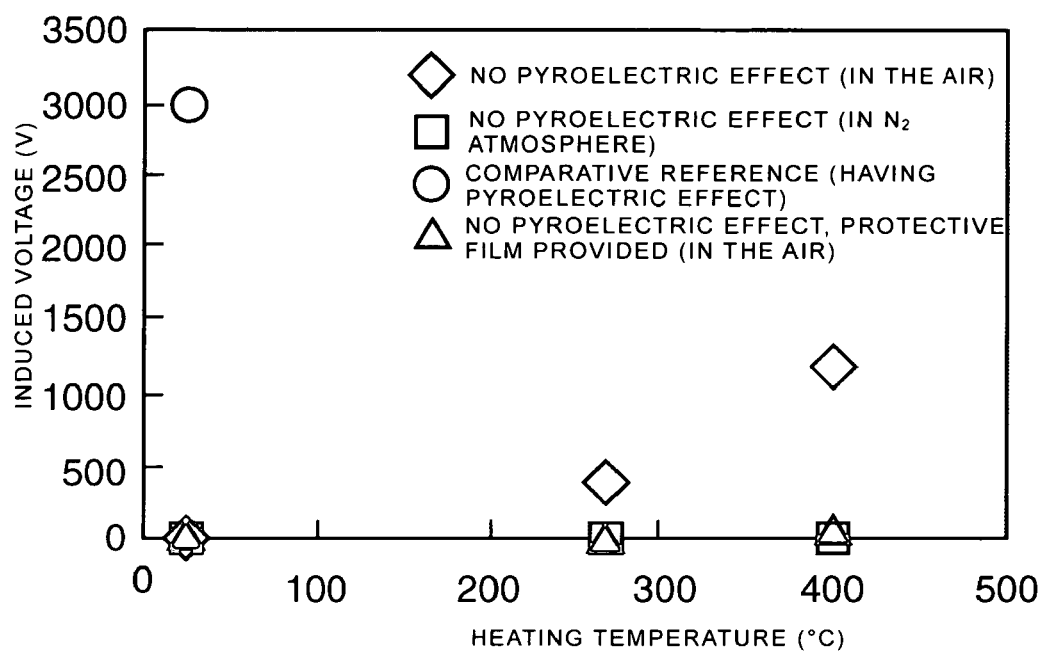
FIG. 2 is a plot of voltages induced at the surfaces of piezoelectric substrates with a low specific resistance by heating the substrates to various temperatures for an hour in air or a nitrogen atmosphere.

Some of these piezoelectric substrates were provided with a protective film. The piezoelectric substrates having no protective film and the piezoelectric substrates having the protective film were heated at respective temperatures for one hour in air. After sufficient time had elapsed, the substrates were each measured for voltage induced at their surfaces by heating to about 100° C. with a heater. The same piezoelectric substrates were heated at respective temperatures in a nitrogen atmosphere in the same manner as described above. After sufficient time had elapsed, the substrates were each measured for voltage induced at their surfaces by heating to about 100° C. with a heater. In FIG. 2, the circle represents the voltage induced by heating a $LiTaO_3$ substrate with a specific resistance of about $10^{14}$ Ω to about 100° C.

FIG. 2 shows that, even in the $LiTaO_3$ substrates having a low specific resistance of about $1.0 \times 10^7$ Ω·cm to about $1.0 \times 10^{13}$ Ω·cm, which do not have the pyroelectric effect, the voltage induced at the surface was increased by heating to high temperatures in air. This means that the substrates can be reoxidized to reproduce a pyroelectric effect. In contrast, when the substrates were heated in a nitrogen atmosphere, or when the substrates having the protective film were heated in an atmosphere containing oxygen, the pyroelectric effect was not reproduced.

In other words, if a piezoelectric substrate with a reduced specific resistance is used for a surface acoustic wave element and a protective film 9 is provided according to present preferred embodiment, the piezoelectric substrate 5 is prevented from reoxidizing even though it is exposed to a high-temperature atmosphere containing oxygen, as in the case of heating in a nitrogen atmosphere shown in FIG. 2. Hence, in the present preferred embodiment, the protective film 9 makes it difficult to reoxidize the surface of the region covered with the protective film 9 of the piezoelectric substrate 5, even though a step or treatment is performed in a high-temperature atmosphere containing oxygen in a manufacturing process of the surface acoustic wave device 1. Thus, the reproduction of the pyroelectric effect is prevented, and the electrodes are prevented from deteriorating or breaking.

In addition to preventing the reproduction of the pyroelectric effect, the protective film 9 can prevent the IDT electrodes 6 from oxidizing and corroding.

For screening for defective devices in a manufacturing process of surface acoustic wave devices using a piezoelectric substrate having a pyroelectric effect, a method is generally applied which detects metal powder resulting in failure, trapped between the fingers of the IDT electrodes. Specifically, a heat load is applied to induce pyroelectric charges in a final step so that electric discharge occurs between the electrode fingers and the metal powder to establish a short circuit between the electrode fingers of the electrodes. Thus, surface acoustic wave elements on which the metal powder is trapped are separated.

As for piezoelectric substrates whose specific resistances have been reduced by oxygen reduction, it is generally difficult to apply this method for screening, because their pyroelectric effects are low.

In the present preferred embodiment, however, the above-described screening step is not necessary. The protective film 9 formed over the IDT electrodes prevents the attachment of metal powder between the fingers of the electrodes. As a result, short-circuiting due to the metal powder between the fingers of the IDT electrodes can be prevented.

Figure 3A:
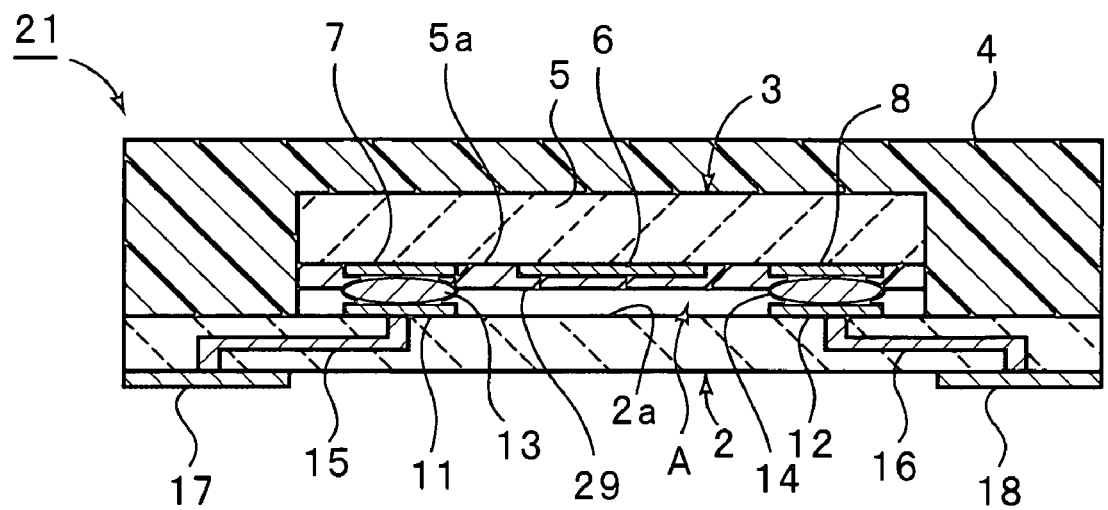
FIG. 3A is a schematic front sectional view of a surface acoustic wave device according to a second preferred embodiment of the present invention.

FIG. 3A is a schematic front sectional view of a surface acoustic wave device according to a second preferred embodiment of the present invention. In the surface acoustic wave device 1 of the first preferred embodiment, the protective film 9 is disposed over the region where the interdigital electrodes 6 are disposed on the main surface 5a of the piezoelectric substrate 4. In a surface acoustic wave device 21 according to the second preferred embodiment, the protective film 29 of the surface acoustic wave element 3 is provided not only over the region having the interdigital electrodes 6, but also over substantially the entire main surface 5a of the piezoelectric substrate 5. However, the upper surfaces of the electrode pads 7 and 8 are at least partially exposed, without being covered with the protective film 29, to establish electrical contacts with the metal bumps 13 and 14.

The other parts of the surface acoustic wave device 21 are formed in the same manner as in the surface acoustic wave device 1 of the first preferred embodiment. The same parts are designated by the same numerals and the description is not repeated.

Figure 3B:
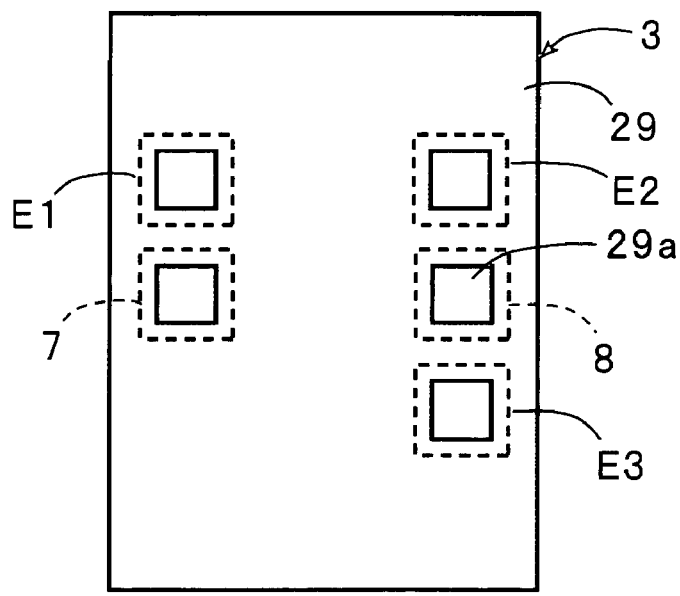
FIG. 3B is a bottom view of a surface acoustic wave element included in the surface acoustic wave device of FIG. 3A.

In the second preferred embodiment, since the protective film 29 is formed over substantially the entire surface of the main surface 5a of the piezoelectric substrate 5, the protective film 29 can prevent the reoxidation of the piezoelectric substrate 5 more effectively and, accordingly, enhance the effect of preventing the short circuiting and corrosion of the electrodes. In the formation of the protective film 29, for example, the film 29 is preferably provided over the entire surface of the main surface 5a of the piezoelectric substrate 5, and is then partially etched for forming the electrode pads 7, 8, E1, E2, and E3. In this instance, the etched areas or the areas of the exposed portions 29a are preferably smaller than the areas of the electrode pads 7, 8, E1, E2, and E3, as shown in the plan view of the surface acoustic wave element 3, FIG. 3B. More specifically, it is preferable that the peripheries of the exposed portions 29a formed by etching lie inside the peripheries of the electrode pads 7, 8, E1, E2, and E3 so that the main surface 5a of the piezoelectric substrate 5 is not exposed. This prevents an intermetallic compound produced between the metal bumps 13 and 14 and the respective electrode pads 7 and 8 from spreading over the entire surfaces of the electrode pads 7 and 8 after the formation of the metal bumps 13 and 14. Since the area of the intermetallic compound is prevented from spreading, the peripheries of the electrode pads are not negatively affected by the intermetallic compound. Consequently, metal powder resulting from the degradation of the peripheries of the electrode pats can be prevented.

Figure 4:
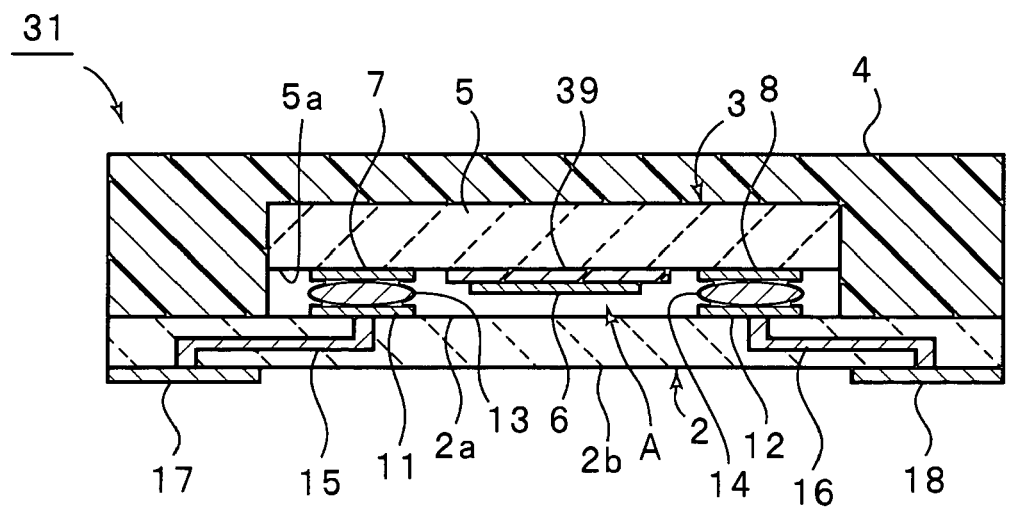
FIG. 4 is a schematic front sectional view of a surface acoustic wave device according to a third preferred embodiment of the present invention.

FIG. 4 is a schematic front sectional view of a surface acoustic wave device according to a third preferred embodiment of the present invention. In this surface acoustic wave device 31, a protective film 39 is formed directly on the main surface 5a of the piezoelectric substrate 5 as a base layer for the interdigital electrodes 6. Other parts of the surface acoustic wave device 31 are formed in the same manner as in the surface acoustic wave device 1 of the first preferred embodiment, except for the protective film 39 serving as the base layer of the interdigital electrodes 6.

The protective film 39 serves as a base layer for the interdigital electrodes 6 in the present preferred embodiment. The protective film 39 prevents the region having the protective film of the piezoelectric substrate 5 from being reoxidized in a high-temperature atmosphere containing oxygen in the manufacturing process of the surface acoustic wave device 1, as in the first preferred embodiment. As a result, the interdigital electrodes 6 are not easily degraded or broken by the pyroelectric effect, as in the first preferred embodiment.

If the interdigital electrodes 6 have a multilayer structure formed by depositing an Al layer on a Ti layer in a structure having the protective film 39, the protective film 39 prevents the Ti layer from taking oxygen from the piezoelectric substrate 5. Thus, the protective film 39 can enhance the electrical stability of interdigital electrodes having such a multilayer structure.

Figure 9:
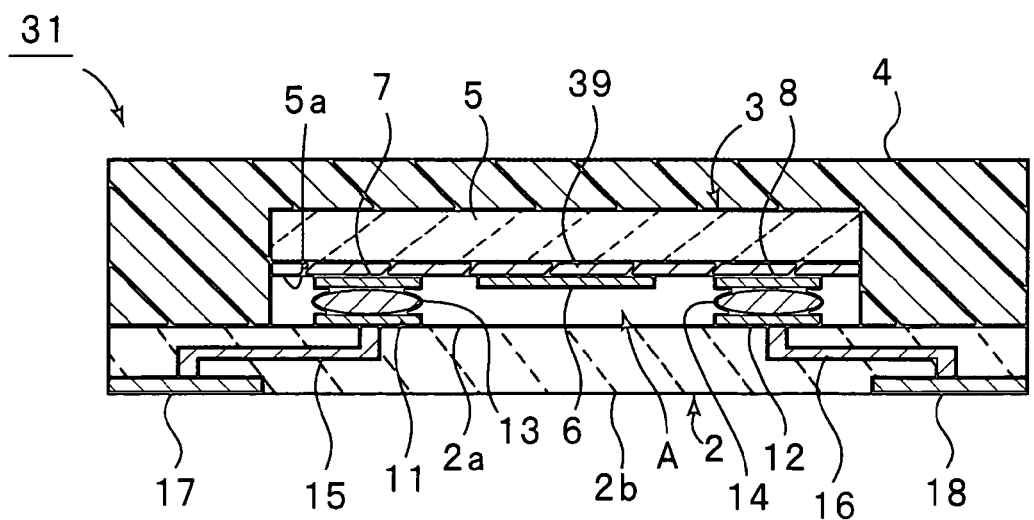
FIG. 9 is a schematic front sectional view of a modification of the surface acoustic wave device according to the third preferred embodiment.

While the protective film 39 shown FIG. 4 is formed as a base layer in the region where the interdigital electrodes 6 are disposed, the protective film 39 may be formed over the entire main surface 5a of the piezoelectric substrate 5, as shown in FIG. 9. In this instance, the protective film 39 also serves as a base layer for the electrode pads 7 and 8, unlike the protective film of the second preferred embodiment. The protective film 39 covering the entire main surface 5a can prevent the reoxidation of the piezoelectric substrate 5 more effectively.

Figure 5:
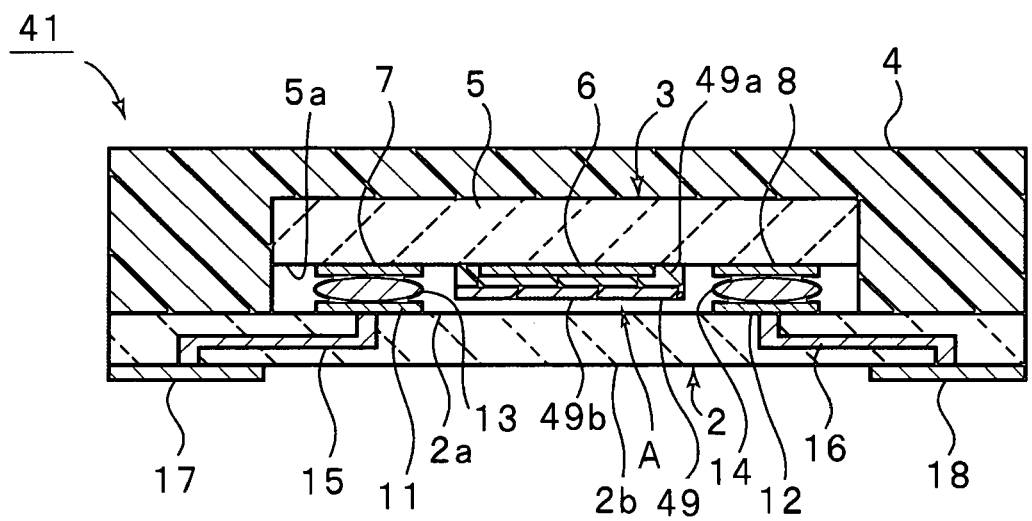
FIG. 5 is a schematic front sectional view of a surface acoustic wave device according to a fourth preferred embodiment of the present invention.

FIG. 5 is a schematic front sectional view of a surface acoustic wave device according to a fourth preferred embodiment of the present invention. This surface acoustic wave device 41 has a multilayer protective film 49. The other parts of the surface acoustic wave device 41 are formed in the same manner as in the surface acoustic wave device 1 of the first preferred embodiment. The protective film 49 includes a first layer 49a formed so as to cover the region having the interdigital electrodes 6 and a second layer 49b formed over the first layer 49a. The protective film may have such a multilayer structure formed by depositing a plurality of materials. Preferably, the first layer 49a is formed of SiN or ZnO and the second layer 49b is formed of $SiO_2$, for example. A SiN layer has superior oxidation resistance and corrosion resistance even if it is thin. A $SiO_2$ layer has a higher stability over a longer period of time than the SiN layer. By forming a $SiO_2$ second layer 49b over a SiN or ZnO first layer, the resulting protective film can stably exert its effect over a long time. Furthermore, the thickness of the multilayer protective film 49 is easy to control, and accordingly, the frequency can be easily controlled by varying the thickness of the protective film. More specifically, when the frequency of the surface acoustic wave element 3 is controlled by varying the thickness of the protective film, the second layer 49b is preferably formed of a material having a wider range of choices in etching conditions and being capable of easily controlling the thickness. For example, a $SiO_2$ layer has a wider range of choices in etching conditions than a SiN layer and the thickness of the $SiO_2$ layer is easier to control than that of a SiN layer. It is therefore preferable that the second layer 49b be formed of $SiO_2$.

While the protective film 49 shown in FIG. 5 is provided only in the region where the interdigital electrodes 6 are disposed, the protective film 49 may be formed over substantially the entire main surface 5a of the piezoelectric substrate 5, as in the surface acoustic wave device 21 of the second preferred embodiment. In this instance, the first layer 49a or the second layer 49b may spread over substantially the entire main surface.

Figure 6:
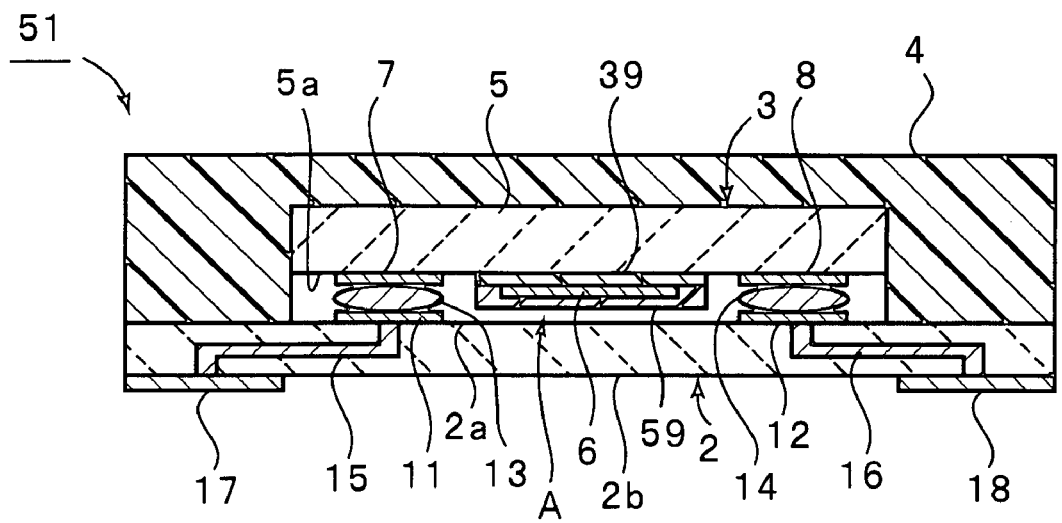
FIG. 6 is a schematic front sectional view of a surface acoustic wave device according to a fifth preferred embodiment of the present invention.

FIG. 6 is a schematic front sectional view of a surface acoustic wave device according to a fifth preferred embodiment of the present invention. In this surface acoustic wave device 51, the interdigital electrodes 6 are disposed on the protective film 39, as in the surface acoustic wave device 31 of the third preferred embodiment. In addition, the surface acoustic wave device 51 has a second protective film 59 arranged to cover the interdigital electrodes 6. In other words, the interdigital electrodes 6 are disposed in a composite of the protective film 39 and the second protective film 59.

The other parts of the surface acoustic wave device 51 are formed in the same manner as in the surface acoustic wave device 31 of the third preferred embodiment.

The interdigital electrodes 6 may be buried in a composite of the protective films as in the surface acoustic wave device 51. In this instance as well, the protective films 39 and 59 prevent the surface of the piezoelectric substrate 5 from being reoxidized by a subsequent step performed in a high-temperature atmosphere containing oxygen. In addition, the second protective film 59 can prevent the oxidation and corrosion of the interdigital electrodes 6.

Figure 10:
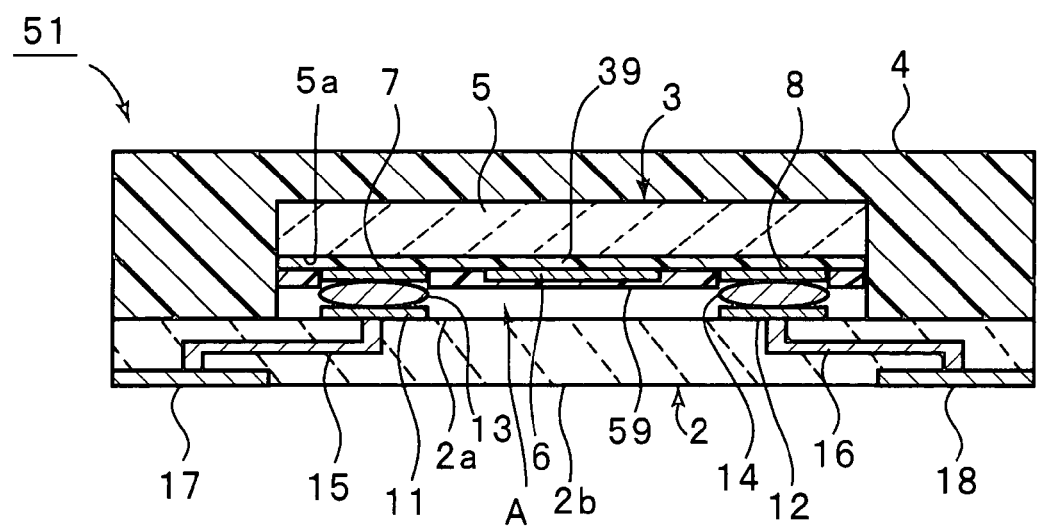
FIG. 10 is a schematic front sectional view of a modification of the surface acoustic wave device according to the fifth preferred embodiment.

In the present preferred embodiment as well, either of the protective films 39 and 59 may spread over substantially the entire main surface 5a of the piezoelectric substrate 5. However, the protective films 39 and 59 must be formed in a region other than regions where the electrode pads 7 and 8 are formed. In these regions, the electrodes pads 7 and 8 need to establish electrical connections with metal bumps 13 and 14, or other suitable connection elements. The protective film 39 may be formed as a base layer for the electrode pads 7 and 8, as shown in FIG. 10. In this instance, the protective film 39 may spread over the entire main surface 5a of the piezoelectric substrate 5.

Figure 7:
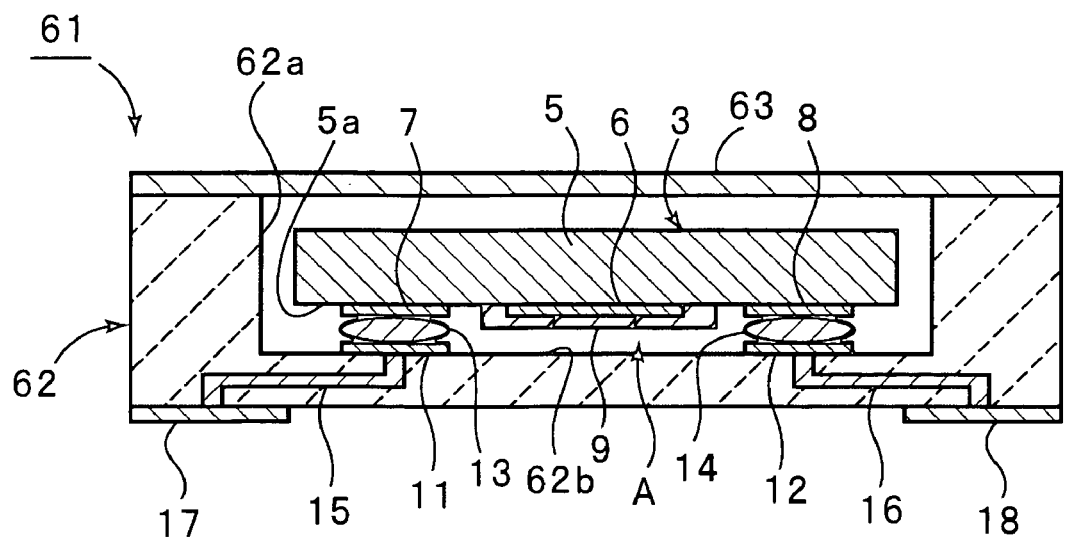
FIG. 7 is a schematic front sectional view of a surface acoustic wave device according to a sixth preferred embodiment of the present invention.

FIG. 7 is a schematic front sectional view of a surface acoustic wave device according to a sixth preferred embodiment of the present invention. This surface acoustic wave device 61 has the same surface acoustic wave element 3 as in the surface acoustic wave device 1 of the first preferred embodiment. In the present preferred embodiment, the package has a different structure from the package of the surface acoustic wave device 1 of the first preferred embodiment. More specifically, the surface acoustic wave device 61 of the present invention uses a package 62 having a recess 62a that is arranged to open upward. The surface acoustic wave element 3 is housed in the recess 62a of the package 62. The bottom 62b of the recess 62a is provided with the electrode pads 11 and 12 on its surface. In addition, the package 62 has the connecting electrodes 15 and 16 and the terminal electrodes 17 and 18 in the same manner as the mount board 2 (see FIGS. 1A and 1B). Then, a cover 63 is bonded to the package 62 with an insulative adhesive or the like so as to close the recess 62a. The package 62 is made of an insulating ceramic as the mount board 2 is. The cover 63 is made of a metal or an insulating material. A metal cover 63 can shield the upper side of the recess 62a from electromagnetism. Furthermore, the presence of the protective film 9 prevents the piezoelectric substrate 5 from being oxidized by face-down bonding.

Figure 8:
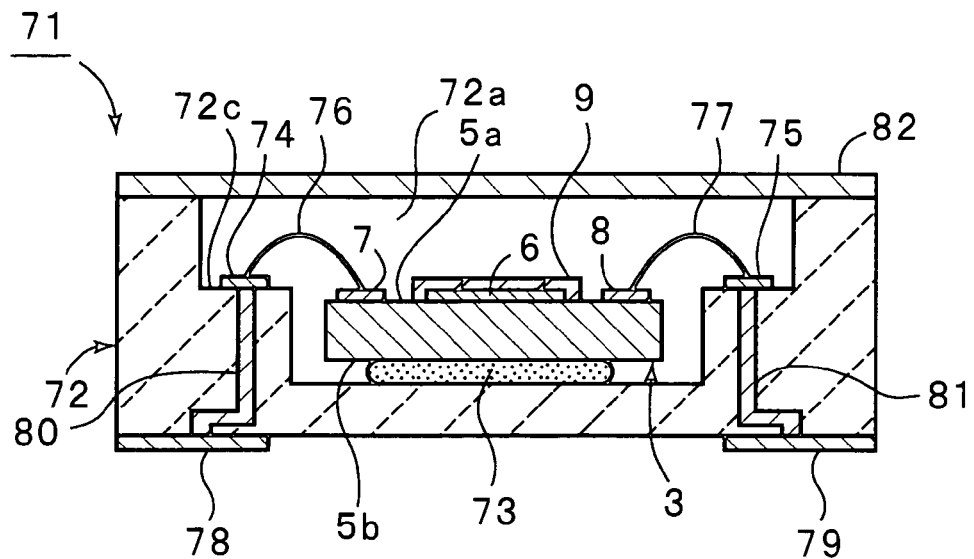
FIG. 8 is a schematic front sectional view of a surface acoustic wave device according to a seventh preferred embodiment of the present invention.

FIG. 8 is a schematic front sectional view of a surface acoustic wave device according to a seventh preferred embodiment of the present invention. In this preferred embodiment, the surface acoustic wave element 3 is housed in a recess 72a of a package 72. In this instance, the surface acoustic wave element 3 is fixed to the package 72 at the other main surface 5b of the piezoelectric substrate 5 with an insulating adhesive 73, but not by face-down bonding.

More specifically, the surface acoustic wave element 3 is housed and fixed in the recess 72a in such a manner that the main surface having the interdigital electrodes 6 faces upward.

The recess 72a of the package 72 has a step 72c on which electrode pads 74 and 75 are disposed. The electrode pads 74 and 75 are connected to the electrode pads 7 and 8 of the surface acoustic wave element 3 with bonding wires 76 and 77.

The package 72 has connecting electrodes 80 and 81 to connect the electrode pads 74 and 75 to terminal electrodes 78 and 79 formed on the bottom surface of the package 72.

A cover 82 is fixed to the package 72 to close the recess 72a. The cover 82 is made of the same material as the cover 63 of the surface acoustic wave device 61 of the sixth preferred embodiment. The presence of the protective film 9 prevents the piezoelectric substrate 5 from being oxidized by die bonding with an insulating adhesive.

As the surface acoustic wave devices 61 and 71 of the sixth and seventh preferred embodiments show, the surface acoustic wave element of the present invention can be used in surface acoustic wave devices having various types of packages. The structure of the package is not particularly limited.

The electrodes of the surface acoustic wave element of the present invention are not limited to the structure shown in FIG. 1B, and the present invention can be applied to surface acoustic wave elements having various electrode structures, such as those used in surface acoustic wave resonators and surface acoustic wave filters.

The surface acoustic wave element according to the first preferred embodiment preferably includes a piezoelectric substrate that has a low specific resistance of about $1.0 \times 10^7$ $\Omega \cdot cm$ to about $1.0 \times 10^{13}$ $\Omega \cdot cm$ and, accordingly, does not produce a pyroelectric effect. In addition, a protective film is arranged so as to cover at least the interdigital electrodes. The protective film can prevent the piezoelectric substrate from being reoxidized by a step performed in a high-temperature atmosphere containing oxygen in a manufacturing process of a surface acoustic wave device including the surface acoustic wave element. Since the piezoelectric substrate is not easily reoxidized even if the surface acoustic wave element is exposed to a high-temperature atmosphere containing oxygen, the interdigital electrodes can be prevented from being degraded or broken, effectively.

Furthermore, the protective film covers the interdigital electrodes to prevent the oxidation and corrosion of the interdigital electrodes.

In the second preferred embodiment as well, the surface acoustic wave element uses a piezoelectric substrate having a low specific resistance of about $1.0 \times 10^7$ $\Omega \cdot cm$ to about $1.0 \times 10^{13}$ $\Omega \cdot cm$ and has a protective film as a base layer for the interdigital electrodes. The protective film prevents the reoxidation of the piezoelectric substrate. Consequently, the piezoelectric substrate in the second preferred embodiment is difficult to reoxidize even if it is exposed to a high-temperature atmosphere containing oxygen. Accordingly, the degradation or breakage of the electrodes resulting from the pyroelectric effect of the piezoelectric substrate does not easily occur.

In the second preferred embodiment, if a second protective film is arranged so as to cover the interdigital electrodes, the second protective film not only prevents the reoxidation of the piezoelectric substrate, but also protects the interdigital electrodes. Thus, the oxidation resistance and corrosion resistance of the interdigital electrodes can be enhanced as in the first preferred embodiment.

The protective film may be formed of various materials. A protective film formed of one material selected from among SiN, ZnO, and $SiO_2$ can prevent the reoxidation of the piezoelectric substrate effectively.

The protective film may have a multilayer structure. If the protective film is formed by depositing a $SiO_2$ layer on a SiN or ZnO layer protective film, its thickness can be reduced because the SiN or ZnO layer has superior oxidation resistance and corrosion resistance even if its thickness is small. In addition, the $SiO_2$ layer has a wider range of choices in etching conditions than the SiN or ZnO layer and the thickness of the $SiO_2$ layer is easier to control than that of the SiN or ZnO layer. By forming a $SiO_2$ layer as the second layer of the protective film, the frequency can be easily controlled with high precision.

For screening defectives, it is tested whether a short circuit is established between metal powder and the fingers of the electrodes. However, if the number of short circuits is one, the short circuit cannot be detected, and screening is not correctly carried out. The protective film prevents the attachment of metal powder on the electrodes.

In various preferred embodiments of the present invention, if a $LiTaO_3$ or $LiNbO_3$ substrate is used as the piezoelectric substrate, the specific resistance of the piezoelectric substrate can be easily reduced to about $1.0 \times 10^7$ $\Omega \cdot cm$ to about $1.0 \times 10^{13}$ $\Omega \cdot cm$ by heating at a high temperature under reduced pressure.

If the protective film is formed over substantially an entire main surface of the piezoelectric substrate on which electrode pads are formed, such that the protective film has regions at which the electrode pads are exposed with an area smaller than that of the electrode pads, the protective film can certainly prevent the reoxidation of the piezoelectric substrate.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention that fall within the true spirit and scope of the invention.

What is claimed is:

1. A surface acoustic wave element comprising:
a piezoelectric substrate having a specific resistance in a range of about $1.0 \times 10^7$ Ω·cm to about $1.0 \times 10^{13}$ Ω·cm;
an interdigital electrode disposed on a main surface of the piezoelectric substrate; and
a protective film covering the interdigital electrode.

2. The surface acoustic wave element according to claim 1, wherein the protective film includes a material selected from the group consisting of SiN, ZnO, and $SiO_2$.

3. The surface acoustic wave element according to claim 1, wherein the protective film includes a SiN or ZnO layer and a $SiO_2$ layer deposited on the SiN or ZnO layer.

4. The surface acoustic wave element according to claim 1, wherein the piezoelectric substrate includes $LiTaO_3$ or $LiNbO_3$.

5. The surface acoustic wave element according to claim 1, further comprising an electrode pad for establishing external electrical connection, disposed on the piezoelectric substrate, wherein the protective film is arranged so as to have a region at which the electrode pad is exposed, and the region has an area that is smaller than the area of the electrode pad.

6. The surface acoustic wave element according to claim 1, further comprising a plurality of interdigital electrodes disposed on the main surface, wherein the protective film is arranged to cover the plurality of interdigital electrodes.

7. The surface acoustic wave element according to claim 1, wherein the protective film is arranged to cover substantially the entire main surface of the piezoelectric substrate.

8. The surface acoustic wave element according to claim 1, wherein the protective film is a multilayer film.

9. A surface acoustic wave device comprising:
a mount board; and
the surface acoustic wave element according to claim 1; wherein
the surface acoustic wave element is mounted on the mount board with the main surface facing downward with a space being provided between the surface acoustic wave element and the mount board and the surface acoustic wave element being sealed to the mount board.

10. A surface acoustic wave device comprising:
a package having a recess;
the surface acoustic wave element according to claim 1 housed in the recess of the package; and
a cover bonded to the package.

11. A surface acoustic wave element comprising:
a piezoelectric substrate having a specific resistance in the range of about $1.0 \times 10^7$ Ω·cm to about $1.0 \times 10^{13}$ Ω·cm;
an interdigital electrode overlying a main surface of the piezoelectric substrate; and
a protective film underlying the interdigital electrode.

12. The surface acoustic wave element according to claim 11, further comprising a second protective film covering the interdigital electrode.

13. The surface acoustic wave element according to claim 11, wherein the protective film includes a material selected from the group consisting of SiN, ZnO, and $SiO_2$.

14. The surface acoustic wave element according to claim 11, wherein the protective film includes a SiN or ZnO layer and a $SiO_2$ layer deposited on the SiN or ZnO layer.

15. The surface acoustic wave element according to claim 11, wherein the piezoelectric substrate includes $LiTaO_3$ or $LiNbO_3$.

16. The surface acoustic wave element according to claim 11, further comprising an electrode pad for establishing external electrical connection, disposed on the piezoelectric substrate, wherein the protective film is arranged so as to have a region at which the electrode pad is exposed, and the region has an area that is smaller than the area of the electrode pad.

17. The surface acoustic wave element according to claim 11, further comprising a plurality of interdigital electrodes disposed on the main surface, wherein the protective film is arranged to cover the plurality of interdigital electrodes.

18. The surface acoustic wave element according to claim 11, wherein the protective film is arranged to cover substantially the entire main surface of the piezoelectric substrate.

19. The surface acoustic wave element according to claim 11, wherein the protective film is a multilayer film.

20. A surface acoustic wave device comprising:
a mount board; and
the surface acoustic wave element according to claim 11; wherein
the surface acoustic wave element is mounted on the mount board with the main surface facing downward with a space being provided between the surface acoustic wave element and the mount board and the surface acoustic wave element being sealed to the mount board.

21. A surface acoustic wave device comprising:
a package having a recess;
the surface acoustic wave element according to claim 11 housed in the recess of the package; and
a cover bonded to the package.

* * * * *